United States Patent [19]

White, Jr. et al.

[11] Patent Number: 4,654,849
[45] Date of Patent: Mar. 31, 1987

[54] HIGH SPEED CONCURRENT TESTING OF DYNAMIC READ/WRITE MEMORY ARRAY

[75] Inventors: Lionel S. White, Jr., Houston; Joseph H. Neal, Missouri City; Bao G. Tran, Houston, all of Tex.

[73] Assignee: Texas Instruments Incorporated, Dallas, Tex.

[21] Appl. No.: 646,656

[22] Filed: Aug. 31, 1984

[51] Int. Cl.$^4$ .................... G06F 11/22; G11C 29/00
[52] U.S. Cl. ........................................ 371/21; 365/201
[58] Field of Search ....................... 371/21, 15, 20; 365/201, 230, 189, 132, 174

[56] References Cited

U.S. PATENT DOCUMENTS

| | | | |
|---|---|---|---|
| 4,419,747 | 12/1983 | Jordan | 365/201 |
| 4,502,131 | 2/1985 | Giebel | 371/21 |
| 4,519,076 | 5/1985 | Pricl | 371/21 |
| 4,553,225 | 11/1985 | Obe | 365/201 |

Primary Examiner—Michael R. Fleming
Attorney, Agent, or Firm—John G. Graham

[57] ABSTRACT

A semiconductor read/write memory device has a normal mode of operation and a test mode. The test mode allows concurrent writing to a number of cells in the cell array so that test patterns may be rapidly loaded. The cell array is split into subarrays and the column addressing circuitry is arranged to provide a maximum of spacing between the cells that are concurrently written. In this manner, pattern sensitivity tests may be run at higher speed because a number of bits at widely spaced positions in the array can be tested simultaneously.

17 Claims, 9 Drawing Figures

HIGH SPEED CONCURRENT TESTING OF DYNAMIC READ/WRITE MEMORY ARRAY

RELATED CASES

This application discloses subject matter also disclosed in copending applications Ser. No. 626,791, filed July 2, 1984, Ser. No. 630,507, filed July 11, 1984, and Ser. No. 634,898, filed July 26, 1984, all assigned to Texas Instruments. Further, this application discloses subject matter also disclosed and claimed in application Ser. No. 646,654, filed herewith by White and McElroy, assigned to Texas Instruments, now abandoned.

BACKGROUND OF THE INVENTION

This invention relates to semiconductor devices, and more particularly to pattern sensitivity testing of cell arrays in dynamic memory devices or the like.

Dynamic MOS read/write memory devices have been constructed generally as shown in U.S. Pat. No. 4,081,701 (a 16K dynamic RAM) issued to White, McAdams and Redwine, or U.S. Pat. No. 4,239,993 (a 64K dynamic RAM) issued to McAlexander, White and Rao, both assigned to Texas Instruments. In the manufacture of these devices, exhaustive testing is required; testing equipment and procedures have been developed and are in common use that utilize repeated patterns written into and read from every cell in a device. One such test is for pattern sensitivity; whether or not a given cell is functioning perfectly is not proved by merely writing and reading a 1 then a 0 to this cell, but instead the influence of writing to and reading from adjacent cells must be examined. A device may pass when one test pattern is used but fail another pattern, and thus it is said to be pattern sensitive. A number of different patterns must be run in order to exhaust most of the possibilities. For example, the so-called walking one test involves writing all zeros to the array, then for each bit a zero is read, a 1 is written then read, then a zero is written, etc., requiring at least five read or write accesses for every cell. Many other patterns such as walking one's and zero's, checkerboard, hammer, etc., are used. Some of the patterns require dozens of accesses per cell, some hundreds.

The amount of influence on one cell caused by accessing nearby cells depends upon the array architecture, addressing circuits, substrate resistivity, process variables, and the like. For example, when one cell is accessed, the whole row containing this cell is read and restored. Every cell is read and restored within the refresh time, 2 or 4 ms. A cell array on an epitaxial substrate may have a higher degree of conduction of majority carriers laterally along the substrate, compared to an array on a homogenous substrate. In any event, the spacing along the array, measured in the number of cells, that is sufficient to exclude any reasonable probability of cross-talk between cells is a variable.

The cost of manufacturing a memory device contains as a significant factor the time required on the test machine to run all of the necessary tests. The cost of the silicon chip itself and its package has remained almost constant, or decreased, as the most-common dynamic RAM memory size has progressed through 1K, 4K, b 16K, and 64K bits. Processing and photolithography improvements have made possible the large scale production of 64K-bit devices for the same cost as 4K or 16K devices. However, the time needed on the test machine to run a given set of patterns is necessarily related to the number of bits in the device; when the number of bits is increased by a factor of four, the time needed to run pattern sensitive tests goes up by a factor of four.

Accordingly, in the manufacture of the next generations of dynamic RAMs, i.e., 256K-bit, 1-Megabit, 4-Megabit and beyond, the cost of testing the devices becomes an increasingly large factor.

It is the principal object of this invention to provide improved test methods and circuitry for high density dynamic RAM devices, particularly for pattern sensitivity testing and the like. Another object is to provide testing circuitry for a dynamic RAM or the like in which the testing time is minimized, and the circuitry added to the device is minimized. A further object is to provide high speed test circuitry for semiconductor devices which contain regular arrays of elements such as memory cells, particularly read/write dynamic cells.

SUMMARY OF THE INVENTION

In accordance with one embodiment of the invention, a semiconductor read/write memory device has a normal mode of operation and a test mode. The test mode allows concurrent writing to a number of cells in the array so that test patterns may be rapidly loaded. The cell array is split into subarrays and the column addressing circuitry is arranged to provide a maximum of spacing between the cells that are concurrently written. In this manner, pattern sensitivity tests may be run at higher speed because a number of bits at widely spaced positions in the array can be tested simultaneously.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE SPECIFIC EMBODIMENT

Figure 1:
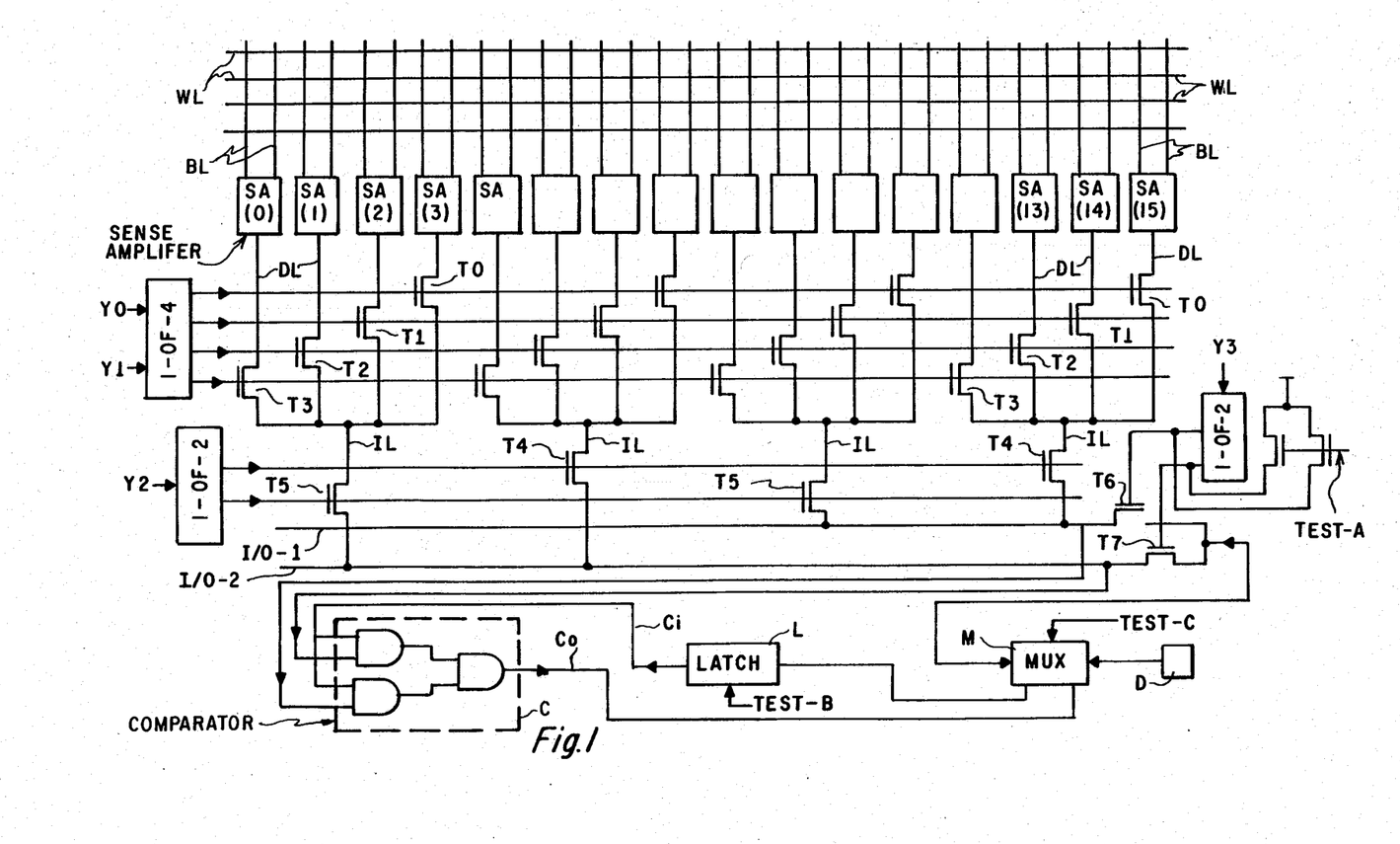
FIG. 1 is an electrical diagram of a memory array illustrating the concept of the invention.

With reference to FIG. 1, an example of the concept of the invention is illustrated. A 256-bit array of memory cells having sixteen rows and sixteen columns is used as an example, although it is understood that the invention would find its primary use in cell arrays for memory devices of perhaps 1-Megabit or more. In the example array, sixteen sense amplifiers SA are employed, each being connected to a pair of bit lines BL, and there would be sixteen cells on each bit line, at intersections with sixteen word lines WL. This is the configuration of a typical dynamic read/write memory using differential latch circuits as sense amplifiers, with folded bit lines; however, the concept is equally applicable to other types of memory devices. Each sense amplifier of FIG. 1 is shown having a single data input/output line DL for reading a data bit from the selected cell or writing a data bit to the selected cell, although instead of this single-rail input/output, dual-rail data paths are applicable. Also, an intermediate I/O buffer may be connected in series with each data line DL. Data input/output selector transistors T0-T3 are activated by a 1-of-4 decoder, based on two address bits Y0 and Y1 to connect one of the four data lines DL in each group to a intermediate line IL. Again, intermediate buffers may be in series with these IL lines. A second level of I/O selector transistors T4 and T5, activated by a 1-of-2 decoder based on address bit Y2, connects one of each pair of lines IL to one of two data I/O lines I/O-1 and I/O-2. Another level of selection is made by transistors T6 and T7 activated by a 1-of-2 decoder based upon address bit Y3; the selected line I/O-1 or I/O-2 is coupled to a data terminal D, through a multiplex circuit M used in a special test condition, as described below.

In a normal read operation, a data bit is read from a selected one of the sixteen sense amplifiers in the following sequence: one-of-four data lines DL is selected in each group of four by the transistors T0-T3; one-of-two intermediate lines IL is selected in each pair by the transistors T4, T5; then one-of-two lines I/O-1, I/O-2 is selected by transistors T6, T7 for connection to data terminal D. A write operation is the reverse sequence: one valid data bit is input to the terminal D; this bit is applied to either I/O-1 or I/O-2 by transistors T6, T7; the data bit then is applied to one of the four lines IL by transistors T4, T5; then the one-of-four data lines DL in the selected group receives the data bit via one of the transistors T0-T3. A row decoder selects one word line WL, and the data bit is written to the selected cell; usually the sense amplifiers SA are activated to implement a read and restore at the beginning of a write cycle.

According to the invention, for one type of test operation, it is possible to write simultaneously to two of the cells. By activating a Test-A control, both of the transistors T6 and T7 are held on, instead of a 1-of-2 selection. Thus, both lines I/O-1 and I/O-2 receive the data bit, and two lines IL are driven, instead of only one. So, two memory cells are written into at the same time. According to an important feature of the invention, the selector circuitry is chosen to maximize the physical spacing between these two bits in the test condition. In this minimal example, the spacing is (N/M−1) or (16/2−1)=7, where N is the number of data lines DL (i.e., the number of columns) and M is the number of cells simultaneously selected.

Ordinarily, the cell array and its column decoders and selector gates are laid out on the semiconductor bar with no concern for this spacing. For example, in the 64K DRAM of U.S. Pat. No. 4,239,993, four adjacent columns are accessed by the Y-selectors within the array, and a 1-of-4 selection is made at the periphery. This arrangement allows a by-four data I/O option, but it would not facilitate simultaneous access of a number of bits for pattern sensitivity testing because the bits would be too close to one another.

A write operation using the Test-A control in the test mode in FIG. 1 reduces the time for writing a pattern to one half of that required if standard write cycles are used. Even if standard read cycles were then used, there would be a significant saving; this is particularly time in test patterns such as the so-called "hammer" or "bit-beater" sequences where a group of cells is written many times before reading adjacent cells so that the effect of repeated writes on leakage, for example, is to be detected. However, the time needed for read operations in the test mode is likewise reduced in the circuit of FIG. 1. Two bits at a time are checked using a comparator circuit having two inputs coupled to the lines I/O-1 and I/O-2. The other inputs Ci of the comparator are from a latch which holds a 1 or 0 loaded from the data terminal D when a Test-B control is activated. The comparator output Co indicates whether or not the two data bits on I/O-1 and I/O-2 from the two selected cells are equal to the value of the bit in the latch. This comparator output Co is coupled off-chip through multiplexer M and data terminal D when a Test-C control is activated. The test controls Test-A, Test-B, and Test-C may be generated in on-chip circuitry that ordinarily is not available to the user in finished system, but instead is accessable only at a test station in the manufacturing facility for the semiconductor device.

Figure 2:
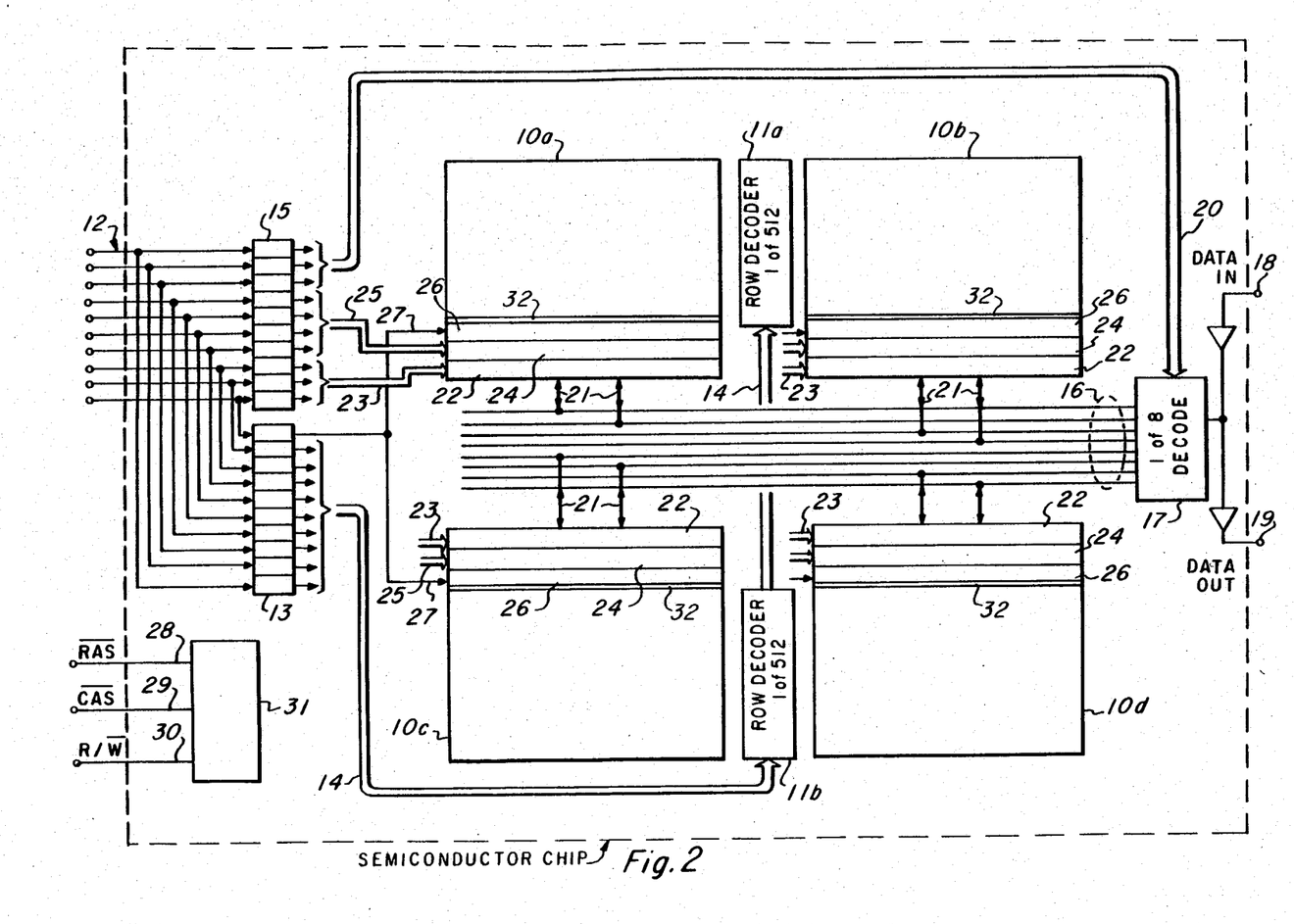
FIG. 2 is an electrical diagram in block form of a dynamic memory device of the 1-Megabit size which may use the testing circuitry of the invention.

Referring to FIG. 2, a block diagram of one example of a semiconductor read/write memory chip is illustrated which may use the test method and circuitry of FIG. 1 according to the invention. This device is of the so-called 1-Megabit size, having 2 or 1,048,576 memory cells in an array of rows and columns. The array is partitioned into four identical blocks 10a, 10b, 10c and 10d, with each block containing 262, 144 cells. Within each block, there are 512 row lines, and all row lines are connected to one of the row decoders 11a or 11b. Each row decoder 11a or 11b receives 9-bits of a 10-bit row address from address input pins 12 by way of row address latches 13 and lines 14. A 10-bit column address is also applied to the input pins 12, time-multiplexed with the row address, and this column address is coupled to buffers 15. Each block contains 512 columns, for a total of 2048 columns, so for a X1 data input/output a 1-of-2048 selection is made in the column addressing circuitry.

Corresponding to the two lines I/O-1 and I/O-2 and the data terminal D of FIG. 1, the device of FIG. 2 employs eight data I/O lines 16 positioned in the center of the array, with one of these eight selected for data input or output by a 1-of-eight selector 17; a single I/O line from this selector 17 is connected through buffers to a data-in pin 18 and a data-out pin 19. The selector 17 (corresponding to transistors T6, T7 of FIG. 1) receives three bits of the column address by lines 20 from the column address buffers 15. Two of the eight lines 16 are connected respectively to each of the blocks 10a, 10b, 10c and 10d by I/O lines 21. A 2-of-16 column selection is made in sixteen second-level intermediate output buffers 22 for each block, using three bits of the column address on lines 23 from buffers 15. A 1-of-16 column selection is made in each of sixteen sets of sixteen first-level intermediate output buffers 24 in each block 10a-10d, using four bits of the column address on lines 25 from buffers 15. Each one of 512 sense amplifiers 26 in each block is connected to one of the columns in the array (each column is made up of two column line halves or "bit lines"). Each buffer 24 is coupled to one of two columns; this selection is based on one bit of the row address from buffers 13 on line 27. With this arrangement of column select, if a concurrent write is performed according to the invention using all eight bits from the data I/O lines 16, the physical separation between the closest selected cells is (2048/8)-1 or 255 cells.

Figure 2A:
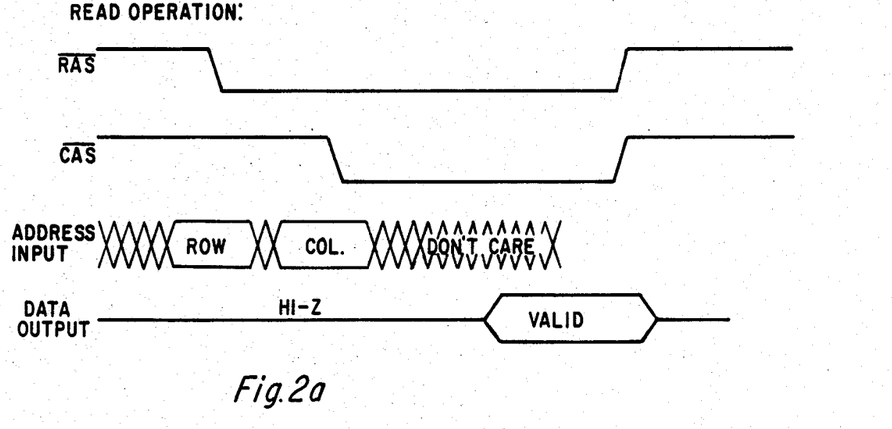
FIG. 2a is a timing diagram of waveforms or events in operation of the device of FIG. 2.

The memory device of FIG. 2 receives a row address strobe $\overline{RAS}$ on input pin 28, and a column address strobe $\overline{CAS}$ on input pin 29. Selection of a read or a write operation is made by a R/$\overline{W}$ control on an input pin 30. A clock generator and control circuit 31 produces all of the internal clocks and controls as needed. For a single-bit read (or write), $\overline{RAS}$ and $\overline{CAS}$ drop to zero in sequence as illustrated in FIG. 2a, and a one-bit data read (or write) occurs. To initiate a test mode, however, a special test input is provided, as by a pad not used in normal operation but accessable to an electrical probe at a multiprobe test station while the device is still in slice form, or by similar methods. According to the invention, a concurrent write or read to eight bits is done in the same cycle time as the one-bit read of FIG. 2a.

Figure 3:
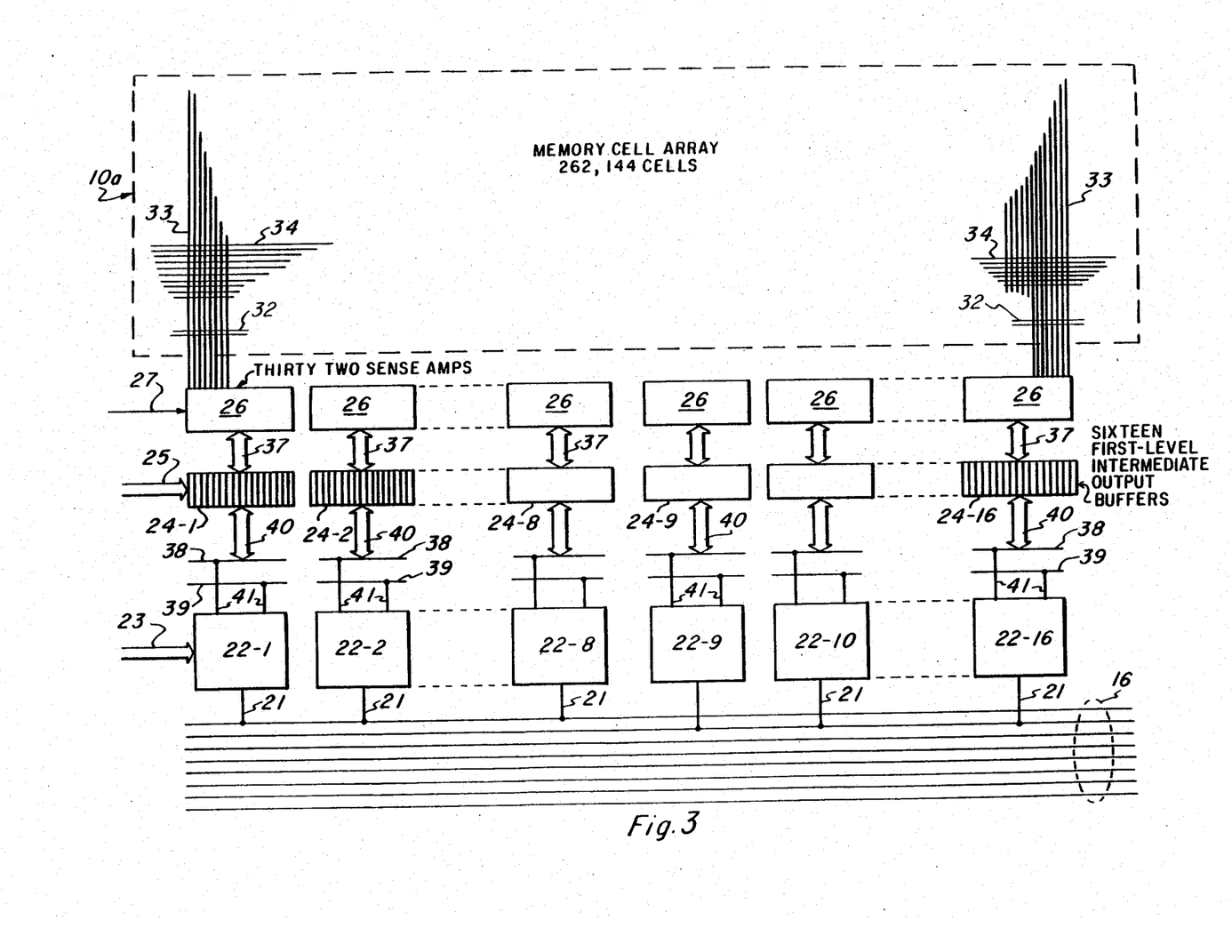
FIG. 3 is an electrical diagram in block form of a part of the memory device of FIG. 2.

Referring to FIG. 3, the I/O lines 16, the intermediate output buffers 22 and 24, and the sense amplifiers 26 are shown in more detail for a part of one of the blocks 10a–10d. In a given block, there are sixteen of the intermediate output buffers 22, in this figure labelled 22-1–22-16. Note that buffers 22-1 through 22-8 are in one group of eight associated with one of the lines 16 for this block, and the buffers 22-9 through 22-16 are in another group of eight connected with the other one of the lines 16 for this block by lines 21. For each one of the sixteen buffers 22-1–22-16, there is a set of sixteen buffers 24; here these sets are labelled 24-1 through 24-16 (sixteen in each set). For each set of sixteen buffers 24, a group of thirty-two sense amplifiers 26 is provided, and two rows of dummy cells 32 extend along the array adjacent the sense amplifiers in the usual manner, as discussed in the above-mentioned U.S. Pat. Nos. 4,239,993 or 4,081,701. Each sense amplifier 26 is connected to two of the bit lines 33 (one column equals two bit lines, or two column line halves). Intersecting the bit lines 33 are 512 row lines 34 in the memory cell array, as well as the dummy row lines 32. One of the two dummy lines is selected by the row decoder 11a, 11b using one bit of the nine-bit row address 14.

The tenth bit of the row address from buffers 13 is applied by the line 27 to a multiplex circuit for the sense amplifiers 26 to select which one of the two sense amplifiers of each pair is connected to the respective buffer 24 by lines 37. There are sixteen pairs of data/data-bar lines 38 and 39 in this block, each pair being coupled to the selected buffers 24 on one side by lines 40 and connected to the selected buffers 22 on the other side by lines 41. The I/O changes from double-rail at the lines 38 and 39 to single rail at the data I/O lines 16 for a write operation, but is single-rail for read.

Figure 4:
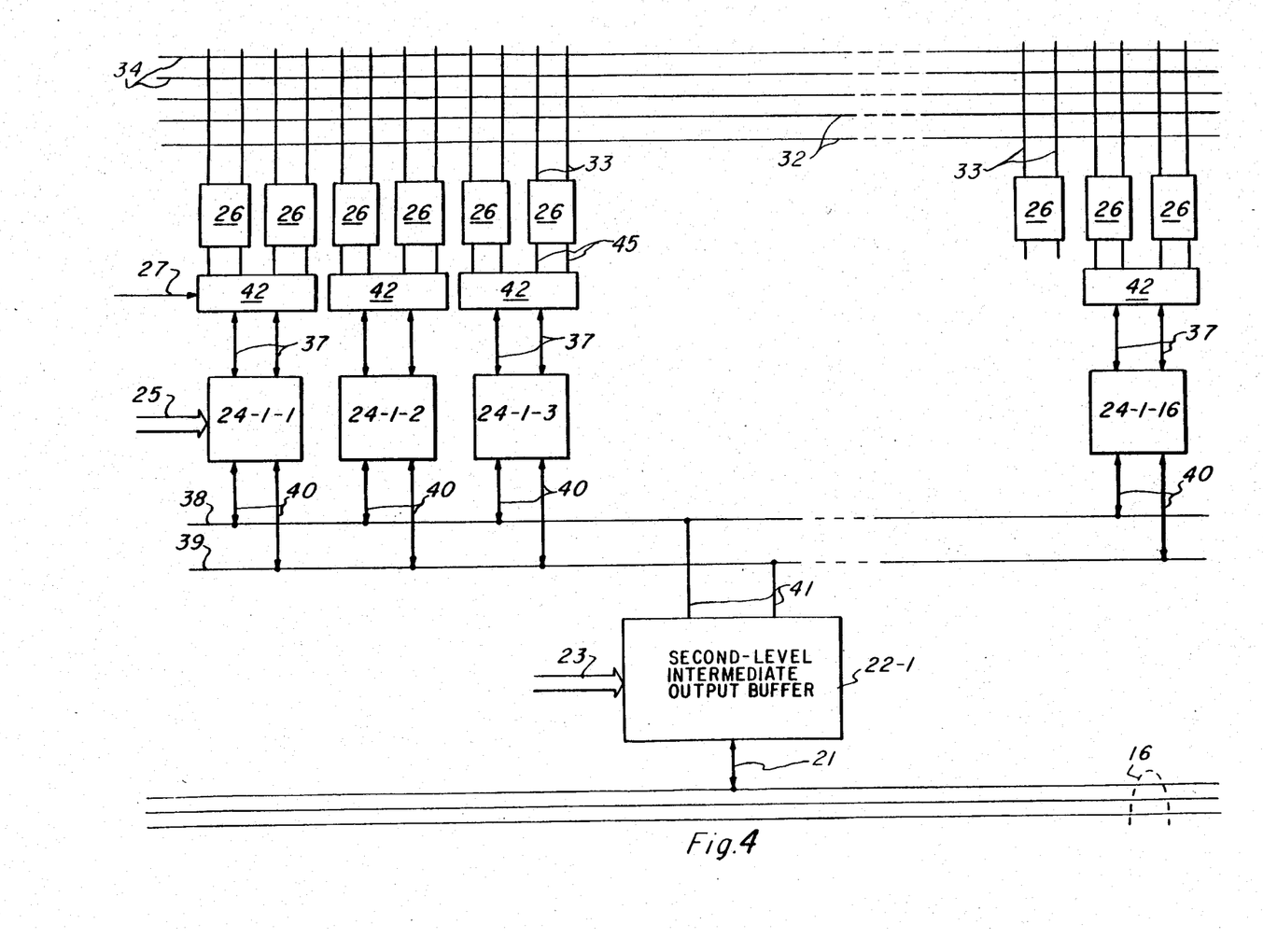
FIG. 4 is an electrical diagram in block form of a part of the circuitry of FIG. 3.

Referring to FIG. 4, a part of the circuitry of FIG. 2 is shown in more detail to illustrate the partitioning. The sense amplifiers 26 associated with the set of sixteen buffers 24-1 are shown. There are actually thirty-two sense amps 26 for this set. This set of sixteen buffers 24-1 is labelled 24-1-1 through 24-1-16 in this figure. Each individual sense amplifier 26 has two bit lines 33 extending from one side, in the so-called folded bit line configuration, meaning that all row lines 34 and both dummy rows 32 are on the same side of the sense amp. A multiplexer 42 for each pair of sense amplifiers 26 selects one, based on the address bit on line 27, for connection to the respective buffer 24-1-1, 24-1-2, etc., by lines 37. Only one of the sixteen buffers 24-1-1 through 24-1-16 is selected at any one time, based on the four column address bits on lines 25, so only one will be operative to couple a read-or-write bit of data to or from the lines 38, 39 by lines 40. The buffer 22-1 of FIG. 3 may or may not be selected by the 2-of-16 selection provided by three bits on lines 23, for coupling the dual-rail I/O lines 38, 39 to the single rail I/O line 16 for this group.

Figure 5:
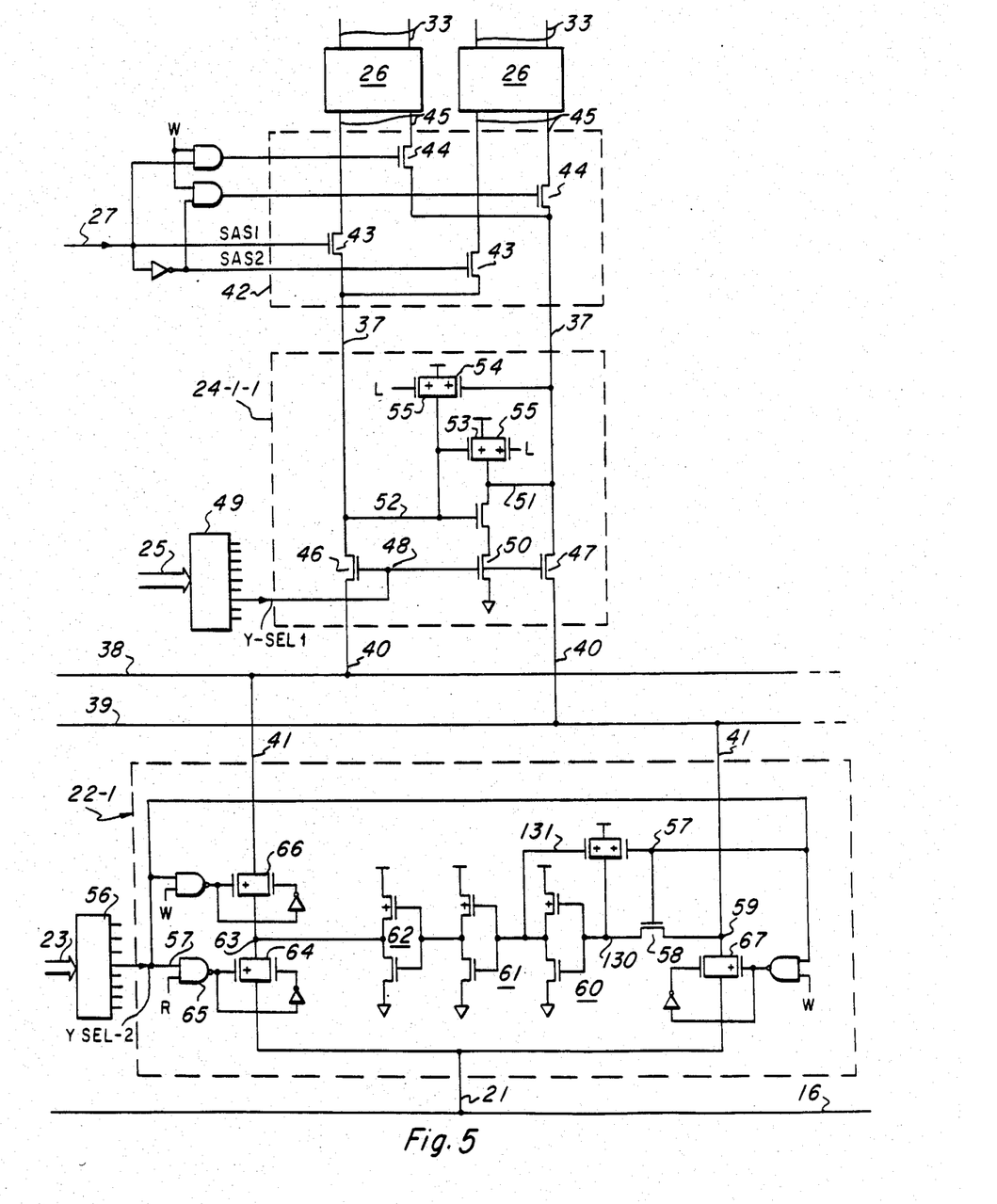
FIG. 5 is an electrical diagram in schematic form of intermediate input/output buffers in the device of FIGS. 2-4.

Turning now to FIG. 5, a detailed schematic diagram is shown for one of the buffers 24, e.g., the buffer 24-1-1 of FIG. 4, and for one of the buffers 22, e.g., the buffer 22-1. This circuitry is the subject of pending application Ser. No. 626,791, filed July 2, 1984 by Poteet & Chang, assigned to Texas Instruments. The multiplexer 42 consists of four transistors; one of two transistors 43 is selected by the address bit line line 27 (SAS1) and its complement (SAS2), so only one of these is on. For read, only one path exists, through the selected one of the transistors 43. For write, one of the transistors 44 is also turned on by the address bit 27 which is ANDed with a write control W from the control circuitry 31, valid when the R/$\overline{W}$ control 30 is in the write condition. Thus, the lines 45 which are inputs or outputs of the sense amplifiers 26 are single-ended for read and dual-rail for write; that is, for read operations both of the transistors 44 are off, and only one of the transistors 43 is on, whereas for write operations one transistor 43 and its associated transistor 44 are conductive. The input/output lines 37 for the multiplexer 42 are connected through source/drain paths of transistors 46 and 47 in the buffer 24-1-1 to the lines 38 and 39. The transistors 46 and 47 are controlled by Y-select information on node 48, which comes from a 1-of-16 decoder 49 receiving the 4-bit column address on lines 25. A transistor 50 also is controlled by the Y-select on node 48; this transistor 50 is in series with an inverter transistor 51 which has a P-channel percharge and load circuit. The path for a single-ended read is from the selected sense amp 26 through a transistor 43 to the gate of the inverter transistor 51, and this transistor functions to produce on its output 52 the complement of the input data bit, but only if the buffer 24-1-1 is selected due to transistor 50 being on. In this read operation the output bit on node 52 is coupled through transistor 47 to line 39, and thus to node 59, through inverters 60, 61 and 62 (only if this buffer is selected), through pass gate 64, and via line 21 to data I/O line 16 for this block.

In the buffer 24-1-1, when the gate of transistor 51 is low, P-channel transistor 53 is on and node 52 is held at the supply voltage Vdd. Likewise, when node 52 is low, P-channel transistor 54 is held on and the gate of the transistor 51 is held high. Both of the lines 37 are precharged high by P-channel transistors 55 which receive a low-going precharge voltage L generated by the circuitry 31 in the precharge cycle after $\overline{RAS}$ goes high.

The buffer 22-1 in FIG. 5 is controlled by Y-select information from address bits on lines 23 and a 2-of-16 decoder 56, so if this buffer is selected a node 57 is high. This condition turns on a transistor 58 and allows the data on line 39 or node 59 to be amplified through three stages 60, 61 and 62 for driving a node 63. For read, a complementary transistor pair 64 is on, due to a read command R from control circuitry 31 applied to NAND gate 65. That is, when R/$\overline{W}$ is high, defining a read operation, then R is high and transistors 64 are both on. At this time, complementary transistor pairs 66 and 67 are off because write control W is low. Thus, for a read operation, the data bit on line 39 controls the line 16 through node 59, cascaded inverters 60, 61 and 62, node 63 and transistors 64. On the other hand, for a write operation, the transistor pairs 66 and 67 will be on, and transistor pair 64 will be off, so node 59 (and line 39) will receive the data bit from line 16 through transistors 67, and node 63 (and line 38) will receive the complement of this bit, thus converting from single-rail (on line 16) to double-rail (on lines 38, 39) during write.

Figure 6:
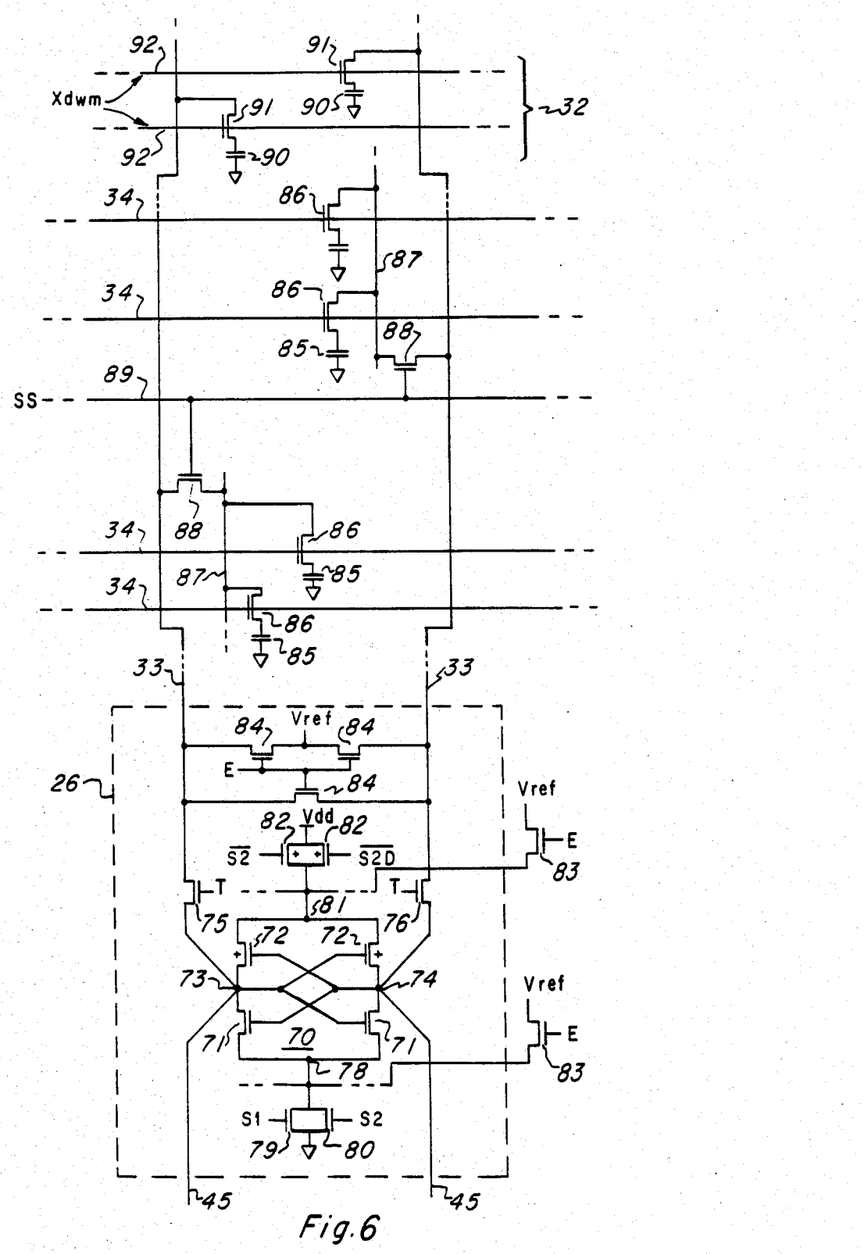
FIG. 6 is an electrical diagram in schematic form of the sense amplifier and cell array of FIGS. 2-5.

Referring to FIG. 6, one of the sense amplifiers 26 is shown in detail. This figure also shows the two bit lines 33 for this sense amplifier and four of the 512 row lines 34 perpendicular to these bit lines. The sense amplifier employs a CMOS cross-coupled flip-flop 70 having N-channel driver transistors 71 and P-channel transistors 72. Sense nodes 73 and 74 are connected to bit lines 33 through the source-drain paths of isolating transistors 75 and 76, as explained in copending application Ser. No. 635,938, filed Aug. 2, 1984, by Charvaka Duvvury and Adin Hyslop, assigned to Texas Instruments. A node 78 on the ground side of the flip-flop 70 is coupled to ground through two N-channel transistors 79 and 80, which have sense clocks S1 and S2 on their gates. The transistor 79 is much smller than the transistor 80, and clock S1 occurs first, so the initial sensing is at a lower-gain condition, and is performed by N-channel transistors 71. On the Vdd side, a node 81 is coupled to the supply through P-channel transistors 82, one of which has sense clock $\overline{S2}$ on its gate and the other a delayed $\overline{S2D}$ on its gate. The sense clock $\overline{S2}$ is the complement of S2, slightly delayed, so the P-channel transistors 72 start to operate only after the second clock S2 is activated. There is a two-interval operation, first S1 for low-current sensing, then S2, $\overline{S2}$ and $\overline{S2D}$ for latching. The transistor pairs 79,80 and the transistors 82, are shared with all of the other sense amplifiers 26 in two blocks 10a and 10b, i.e., 1024 sense amplifiers. The nodes 78 and 81 are precharged to about one-half Vdd by transistors 83 when E is high.

The bit lines 33 are precharged and equalized through three transistors 84 which have an equalize clock voltage E on their gates; two of these transistors 84 have their sources connected to a reference voltage Vref. The value of this reference voltage is about half Vdd, so little or no net charge is needed from the chip supply Vdd to precharge all of the bit lines. That is, one line 33 will be high and the other low for each sense amplifier, so one will charge the other, and Vref need only supply any differential that might have occurred. Like the clock L, the clock E is generated in the control circuitry 31 after the end of an active cycle, when $\overline{RAS}$ goes high.

Each of the memory cells consists of a capacitor 85 and an access transistor 86, with the gates of all of the 512 access transistors 86 in a row being connected to a row line 34. Only one row line 34 of 512 in the block is turned on at any one time, so only one memory cell capacitor 85 is connected to a bit line 33 for a given sense amplifier 26. According to the invention of application Ser. No. 634,898, filed July 26, 1984 by David J. McElroy, assigned to Texas Instruments, in order to reduce the ratio of the bit line capacitance to the value of the storage capacitance 85, a number of bit line segments 87 are employed for each pair of bit lines 33. One of these segments 87 is coupled to a bit line 33 at a given time by one of the transistors 88. For example, each segment 87 may have thirty-two cells connected to it, so in the embodiment disclosed herein there must be sixteen of these segments 87 for each sense amplifier (16×32=512). Half of the segments are connected to one bit line and half to the other. The row decoder 11a or 11b selects the appropriate one of eight lines 89 by a segment select voltage SS, at the same time as this decoder selects 1-of-512 row lines 34, based on certain ones of the same nine address bits from lines 14.

In the dummy rows 32, a pair of dummy cells are provided for each pair of bit lines 33, and these dummy cells consist of dummy capacitors 90 and access transistors 91. When the selected storage cell is on the left-hand bit line 33, then the right-hand dummy cell is selected in the row decoders 11a, 11b by one of the decoder output lines 92, and vice versa, in the usual manner. One bit of the row address is used in the row decoder to select one or the other of these lines 92 of the dummy cell rows 32.

Figure 7:
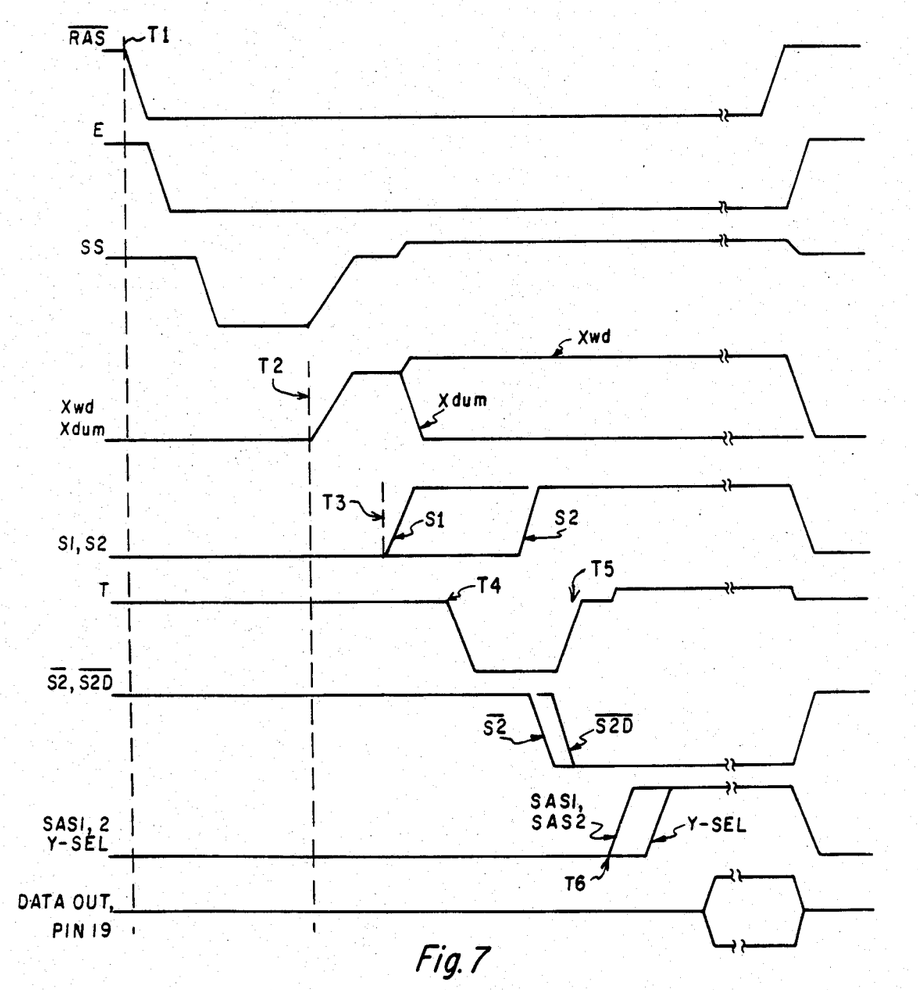
FIG. 7 is a timing diagram showing voltage vs. time for various nodes in the circuit of FIGS. 2-6.

Referring to FIG. 7, the sequence of operation of the memory device of FIGS. 2-6 will be explained for a single-bit read in normal operation. An active cycle begins with the $\overline{RAS}$ voltage dropping from +5 to zero at the time t1. This example is a read cycle, so at time t1 the R/$\overline{W}$ input voltage is high. The time prior to t1 is a precharge period, during which the equalize voltage E has been high, so all of the bit lines 33 and the nodes 78 and 81, have been precharged to the Vref voltage, assumed to be about ½ Vdd or +2.5. The segment select signal SS on all lines 89 is also held high during the precharge cycle, so all of the segments 87 are also precharged to the Vref voltage. The dropping of $\overline{RAS}$ at t1 causes the equalize voltage E to drop, isolating the pairs of bit lines 33 from each other and from Vref. The segment select signal SS then drops, isolating all of the segments 87 from the bit lines 33. As soon as the row decoders 11a, 11b have had time to respond to the row address, at time t2 the Xwd and Xdum voltages start to rise on the selected 1-of-512 row line 34 and selected 1-of-2dummy line 92; at the same time t2, the segment-select signal SS on one of the lines 89 is brought up. These address voltages Xwd, Xdum and SS are brought up rather slowly to Vdd, and then later in the read cycle, after sensing is completed, SS and Xwd are boosted above Vdd to eliminate the Vt drop across the access transistors 86 and 88 so a full 1 level is restored. The Xdum voltage falls shortly after sensing begins, since the function of the dummy cells is completed during initial sensing, and the dummy capacitors can be decoupled from the bit lines so these capacitors can be precharged, as disclosed in copending application Ser. No. 630,507, filed July 11, 1984 by Tran, McAdams and Childers, assigned to Texas Instruments. At time t3, the sense amplifiers 26 are first activated by the S1 voltage going high, turning on the high-impendence N-channel transistor 79; this begins to separate the bit lines 33 further than the separation caused by the differential voltages on the storage cell and dummy cell. But before any significant amount of current flows from the supply Vdd through transistors 72 or to Vss through transistors 71, the T voltage falls at t4, isolating the bit lines 33 from the sense nodes 73 and 74. After the T voltage falls, the sense voltage S2 is brought up, so the large transistor 80 begins to conduct; also $\overline{S2}$ drops, so one P-channel load transistor 82 begins to conduct, then after a slight delay $\overline{S2D}$ falls, so the larger P-channel transistor 82 begins to conduct. After S2 rises and $\overline{S2}$, S2D drop, the T voltage is brought up to Vdd at time t5; it is at this point that the bit lines 33 are driven to a full rail-to-rail level by the latch transistors 71 and 72. Then, at time t6, the sense-amp-select voltage SAS1 or SAS2 (selected by address bit 27) goes high, connecting one of the bit lines for one sense amplifier in each pair to a buffer 24 via lines 37 of FIG. 4, using the multiplexer 42. Just after this the Y-select outputs Ysel-1 and Ysel-2 from the column decoders are valid, so the selected data bit becomes valid on the line 16, and shortly thereafter the data bit is valid on the output pin 19.

Figure 8:
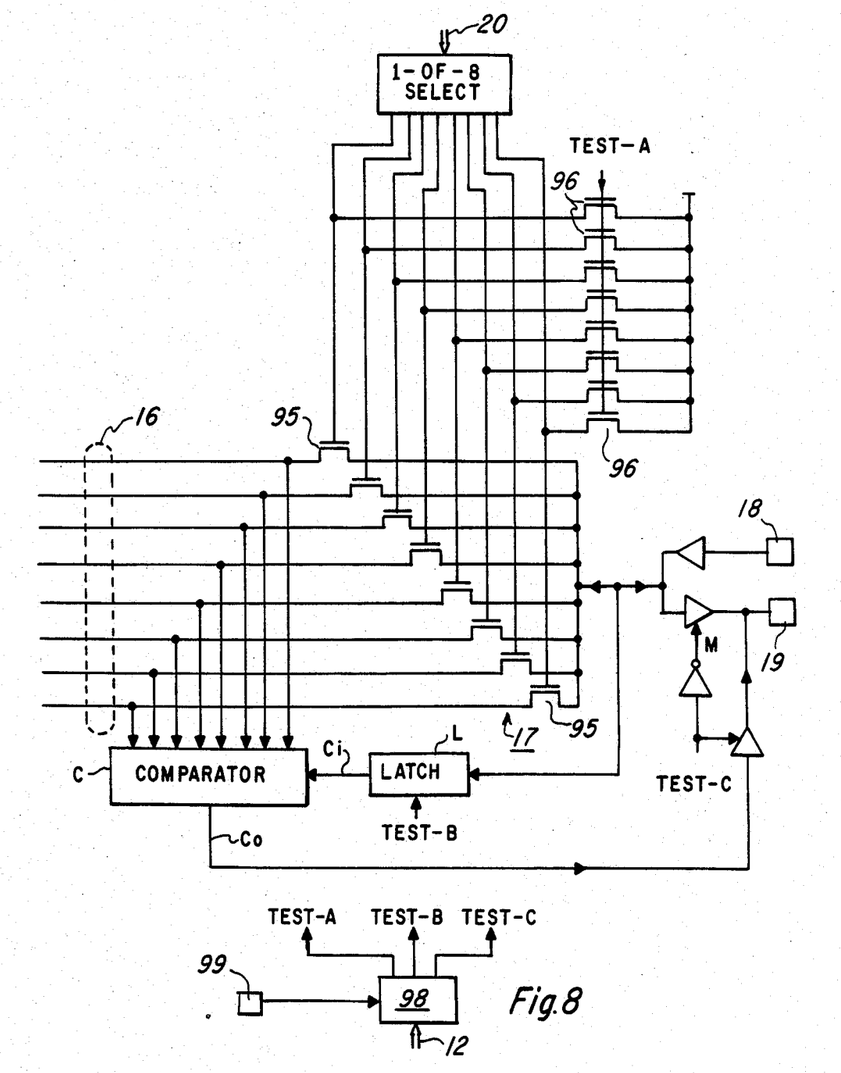
FIG. 8 is an electrical diagram of test control circuitry for the device of FIGS. 2-6.

In FIG. 8, the test control circuitry for the device of FIGS. 2-6 is illustrated according to the invention. As in FIG. 1, a concurrent write is performed by imposing an 8-of-8 select on the transistors 95 in the decoder 17 instead of a 1-of-8 select. When a Test-A control signal is invoked, transistors 96 apply Vdd voltage to the gates of all of the transistors 95. An input bit applied to the input terminal 18 is coupled to all eight of the lines 16 instead of only one. A concurrent read is performed by the comparator C which checks whether or not all eight of the lines 16 contain the same data bit as the input Ci from latch L. The output Co from the comparator is coupled to the data output terminal 19 through multiplexer M when the Test-C control signal is invoked. If there is one bad bit, then the device fails and is set aside; later, for failure analysis, the specific bit may be identified using the 1-of-8 addressing instead of 8-of-8. The latch L is loaded with 1 or 0 from the input terminal 18 when a Test-B control signal is invoked.

In operation, at a multiprobe test station, a pattern is written into the array usng concurrent write, i.e., generating the Test-A command in each cycle. This requires only one-eighth the time that it would have, i.e., 128K cycles instead of 1-M. The latch L is flipped (if the data bit is to be charged), requiring only one memory cycle, in which Test-B is generated. Then 128K read cycles are performed to read all bits, employing concurrent read with the Test-C control being generated each cycle.

The test control signals may be generated in control circuit 98 which is activated by an input 99 from a pad which is not bonded out in the finished device, but instead is contacted by an electrical probe at the multiprobe test station. Or, a terminal of the device used in normal operating may invoke the test mode when activated by an over voltage. When the circuit 98 is activated, it generates a specific test control in response to an address on terminals 12. This control may remain in effect during the next cycle, or until cancelled, so then the address terminals 12 are used for their ordinary address input function.

When this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A method of testing an array of rows and columns of read/write memory cells in a semiconductor memory device formed in the face of a semiconductor body, in order to detect sensitivity to patterns of writing data to and reading data from closely-spaced cells in the array, comprising:

applying a single bit of data to a terminal of the device while invoking a test mode of operation to cause the single bit to be written concurrently to a plurality of M memory cells in the array, where M is an integer, said plurality of M memory cells being physically spaced from one another along said face in said array by a number of cells substantially greater than four, and thereafter reading the data from all of said plurality of M memory cells, and comparing the data read from the cells with the data written to the cells.

2. A method acording to claim 1 wherein said M memory cells are physically spaced from one another along said face by a number of cells no less than the total number of said columns divided by M, minus 1; and wherein said step of invoking a test mode of operation changes data paths between said terminal and a plurality of M parallel data I/O lines within said device.

3. A method according to claim 2 wherein said data paths include a 1-of-M selector employed in a normal mode of operation.

4. A method according to claim 2 wherein said step of reading includes detecting the state of a plurality of a cells in parallel and producing an output indicative of whether or not all of the states are the same.

5. A method according to claim 4 wherein said device includes a normal mode of operation wherein only a number of cells substantially smaller than M is written when a data input is applied to said terminal.

6. A method of testing an array of rows and columns of read/write memory cells in a semiconductor memory device formed in the face of a semiconductor body, in order to detect sensitivity to patterns of writing data to and reading data from closely-spaced cells in the array, comprising:

writing concurrently to a plurality of M memory cells in the array in a test mode of operation, where M is an integer and is greater than the number of cells concurrently written in a normal mode of operation of the device, said plurality of M memory cells being physically spaced from one another along said face in said array by a number of cells of at least four and no less than the total number of said columns, divided by M, minus one, and thereafter reading the data from all of said plurality of M memory cells, and comparing the data read from the cells with the data written to the cells.

7. A method according to claim 6 wherein said test mode of operation employs data paths between a terminal of said device and a plurality of M parallel data I/O lines within said device.

8. A method according to claim 6 wherein said data paths include a 1-of-M selector employed in said normal mode of operation, and an M-of-M selector employed in said test mode of operation.

9. A method according to claim 6 wherein said array contains a plurality of subarrays of cells, each subarray having the same number of rows as said array.

10. A method according to claim 9 wherein said single bit is written concurrently to each of said subarrays.

11. A semiconductor read/write memory device having an array of rows and columns of memory cells, comprising:

addressing means having a normal mode of operation, said addressing means also having a test mode of operation for performing pattern sensitive tests, test control means coupled to said addressing means for applying a test control signal to the addressing means, said addressing means receiving an address and selecting one of said rows for activation and selecting one of said columns for coupling to a data terminal when said addressing means is in said normal mode of operation, said addressing means receiving said test control signal and receiving an address and selecting one of said rows for activation and selecting M columns for coupling to said data terminal when said addressing means is in said test mode of operation, said M columns being spaced from one another in said array by a number of columns equal to at least an integral power of 2, said number being at least four.

12. A device according to claim 11 including means for writing concurrently to said M columns when in said test mode of operation.

13. A device according to claim 12 including means for detecting whether or not cells in all of said M for detecting whether or not cells in all of said M columns contain the same data, when in said test mode of operation.

14. A device according to claim 13 wherein an output of said means for detecting is coupled to said data terminal.

15. A device according to claim 14, wherein said array contains M subarrays, each subarray containing the same number of rows as said array, one column in each subarray being selected in said test mode of operation.

16. A semiconductor read/write memory device comprising:

an array of N memory cells having R rows of cells and C columns of cells, where $C>R$ and $R<\sqrt{N}$, and R and C are powers of 2; the array containing B subarrays, each subarray having C/B columns and R rows;

row addressing means for activating one of said rows in response to a row address;

test control means generating a test control signal when said memory device is in a test mode of operation;

column addressing means having a normal mode of operation, and having a test mode of operation for performing pattern sensitive tests when said test control signal is received from said test control means, said column addressing means:

selecting one-of-C/B columns in each of said subarrays, and selecting one-of-B of said subarrays for input or output of data, in said normal mode of operation, or selecting one-of-C/B columns in each of said subarrays and activating all of said B subarrays for input or output of data, in said test mode of operation, in response to receiving said test control signal, wherein each one of said one-of-C/B columns selected in each of said subarrays is spaced from any other selected column by a number of columns of at least four and no less than C/B minus 1.

17. A device according to claim 16 wherein said device is formed at a face of a semiconductor body, and the physical spacing of C/B minus 1 columns along said face is a distance sufficient to avoid substantial influence of cells in one selected columns upon cells in another selected column in said test mode of operation.

* * * * *

REEXAMINATION CERTIFICATE (3784th)
United States Patent [19]
White, Jr. et al.

[11] B 4,654,849
[45] Certificate Issued Jun. 22, 1999

[54] HIGH SPEED CONCURRENT TESTING OF DYNAMIC READ/WRITE MEMORY ARRAY

[75] Inventors: Lionel S. White, Jr., Houston; Joseph H. Neal, Missouri City; Bao G. Tran, Houston, all of Tex.

[73] Assignee: Texas Instruments Incorporated, Dallas, Tex.

Reexamination Request:
No. 90/004,393, Sep. 30, 1996

Reexamination Certificate for:
Patent No.: 4,654,849
Issued: Mar. 31, 1987
Appl. No.: 08/646,656
Filed: Aug. 31, 1984

[51] Int. Cl.$^6$ ............................ G11C 29/00; G06F 11/22
[52] U.S. Cl. ............................................ 371/21.2; 365/201
[58] Field of Search ........................ 371/21.1, 21.2, 371/20.1; 365/201, 200

[56] References Cited

U.S. PATENT DOCUMENTS

| | | |
|---|---|---|
| 4,419,747 | 12/1983 | Jordan ........................................ 365/201 |
| 4,464,750 | 8/1984 | Tatematsu . |
| 4,495,603 | 1/1985 | Varshney ................................. 365/233 |
| 4,502,131 | 2/1985 | Giebel ...................................... 365/201 |
| 4,519,076 | 5/1985 | Priel et al. ................................ 371/21 |
| 4,541,090 | 9/1985 | Shiragasawa .......................... 371/21.2 |
| 4,553,225 | 11/1985 | Obe .......................................... 365/201 |

FOREIGN PATENT DOCUMENTS

| | | | |
|---|---|---|---|
| 53-120234 | 10/1978 | Japan ............................. | G11C 11/34 |
| 57-208697 | 12/1982 | Japan ............................. | G11C 29/00 |

*Primary Examiner*—Phung Chung

[57] ABSTRACT

A semiconductor read/write memory device has a normal mode of operation and a test mode. The test mode allows concurrent writing to a number of cells in the cell array so that test patterns may be rapidly loaded. The cell array is split into subarrays and the column addressing circuitry is arranged to provide a maximum of spacing between the cells that are concurrently written. In this manner, pattern sensitivity tests may be run at higher speed because a number of bits at widely spaced positions in the array can be tested simultaneously.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 16 and 17 are confirmed.

Claims 1, 6 and 11 are determined to be patentable as amended.

Claims 2-5, 7-10, 12-15, dependent on an amended claim, are determined to be patentable.

1. A method of testing an array of rows and columns of read/write memory cells in a semiconductor memory device formed in the face of a semiconductor body, in order to detect sensitivity to patterns of writing data to and reading data from closely-spaced cells in the array, comprising:

*arranging the array into a plurality of subarrays, each subarray having a separate row selected from a plurality of rows in said array;*

*activating the plurality of rows in response to an address signal;*

*activating a plurality of adjacent sense amplifiers, each sense amplifier coupled to a respective memory cell in one of said separate rows selected from the plurality of rows;*

*providing a data terminal for transferring data to the array of read/write memory cells in a normal mode of operation;* applying a single bit of data to [a] *said data* terminal of the device while invoking a test mode of operation to cause the single bit to be written concurrently to a plurality of M memory cells in the array, where M is an integer, said plurality of M memory cells being physically spaced from one another along said face in said array by a number of cells substantially greater than four, *said plurality of M memory cells being positioned in at least two different ones of said plurality of subarrays,* and thereafter reading the data from all of said plurality of M memory cells, and comparing the data read from the cells with the data written to the cells, *said comparison being performed in a single read cycle.*

6. A method of testing an array of rows and columns of read/write memory cells in a semiconductor memory device formed in the face of a semiconductor body, in order to detect sensitivity to patterns of writing data to and reading data from closely-spaced cells in the array, comprising:

*arranging the array into a plurality of subarrays, each subarray having a separate row selected from a plurality of rows in the array;*

*activating the plurality of rows in response to an address signal;*

*activating a plurality of adjacent sense amplifiers, each sense amplifier coupled to a respective memory cell in a respective row from the plurality of rows;* writing concurrently to a plurality of M memory cells in the array in a test mode of operation, where M is an integer and is greater than the number of cells concurrently written in a normal mode of operation of the device, said plurality of M memory cells being physically spaced from one another along said face in said array by a number of cells of at least four and no less than the total number of columns, divided by M, minus one, *at least two of said plurality of M memory cells being located in a separate subarray;* and thereafter reading the data from all of said plurality of M memory cells, and comparing the data read from the cells with data written to the cells, *said comparison being preformed in a single read cycle.*

11. A semiconductor read/write memory device having an array of rows and columns of memory cells, comprising:

addressing means having a normal mode of operation, said addressing means also having a test mode of operation for performing pattern sensitive tests;

test control means coupled to said addressing means for applying a test control signal to the addressing means;

said addressing means receiving an address and selecting one of said rows for activation and selecting one of said columns for coupling to a data terminal when said addressing means is in said normal mode of operation;

*arranging said array into a plurality of subarrays, each subarray having a separate row of memory cells selected from said one row selected for activation, and having columns of said array;* said addressing means receiving said test control signal and receiving an address and selecting one of said rows for activation and selecting M columns for coupling to said data terminal when said addressing means is in said test mode of operation, said M columns being spaced from one another in said array by a number of columns equal to at least an integral power of 2, said number being at least four, *at least two of said M columns being located in separate ones of said subarrays.*

* * * * *